US006973294B1

(12) United States Patent
Matthew et al.

(10) Patent No.: US 6,973,294 B1
(45) Date of Patent: Dec. 6, 2005

(54) AUTOMATIC TUNING AM TRANSMITTER

(75) Inventors: Scott Matthew, Fond du Lac, WI (US); Tony Esdaile, Hertfordshire (GB); Michael Milne, Hertfordshire (GB)

(73) Assignee: Radio Technologies, LLC., Glenview, IL (US)

( * ) Notice: Subject to any disclaimer, the term of this patent is extended or adjusted under 35 U.S.C. 154(b) by 986 days.

(21) Appl. No.: 09/938,170

(22) Filed: Aug. 23, 2001

Related U.S. Application Data

(63) Continuation-in-part of application No. 09/201,366, filed on Nov. 30, 1998, now Pat. No. 6,295,443.

(51) Int. Cl.[7] ................................................ H03C 1/62
(52) U.S. Cl. .................................................. 455/115.1
(58) Field of Search ...................................... 455/115.1

(56) References Cited

U.S. PATENT DOCUMENTS

| | | | |
|---|---|---|---|
| 3,732,496 A | 5/1973 | Boyer | |
| 3,794,941 A | 2/1974 | Templin | |
| 4,060,808 A | 11/1977 | Foldes | |
| 4,112,395 A | 9/1978 | Seward | |
| 4,117,493 A | 9/1978 | Altmayer | |
| 4,165,487 A | 8/1979 | Corderman | |
| 4,234,960 A | 11/1980 | Spilsbury et al. | |
| 4,538,465 A | 9/1985 | Bianchi et al. | |
| 4,620,194 A | 10/1986 | Bel Moratalla | |
| 4,726,071 A | 2/1988 | Jachowski | |
| 4,817,193 A | 3/1989 | Matthew | |
| 5,225,847 A | 7/1993 | Roberts et al. | |
| 5,253,511 A | 10/1993 | Jaramillo et al. | |
| 5,446,920 A | 8/1995 | Matsumoto et al. | |
| 6,295,443 B1 * | 9/2001 | Matthew et al. | 455/115.1 |

OTHER PUBLICATIONS

Dwayne L. Kincaid, "An Automatic Antenna Tuner: The AT-11," *QST,* vol. 80, No. 1, P. 35 (Jan. 1996).

* cited by examiner

*Primary Examiner*—Creighton Smith
(74) *Attorney, Agent, or Firm*—Marshall, Gerstein & Borun LLP

(57) ABSTRACT

A radio transmitter is adapted to automatically adjust aerial impedance for a selected radio frequency. The radio transmitter includes a tunable radio frequency signal generator that has an impedance and is adapted to generate a radio frequency signal in the range of approximately 510 kilohertz to approximately 1705 kilohertz. The radio transmitter is also adapted to receive less than or equal to approximately 100 milliwatts of total input power. An aerial coupled to the tunable radio frequency signal generator and is adapted to transmit the radio frequency signal. The aerial has an output voltage, an aerial impedance and a length of less than or equal to approximately three meters. An adjustable inductor coupled to the aerial. A sampler coupled to the aerial and is adapted to measure the aerial output voltage. A processing unit is coupled to the sampler and to the adjustable inductor. The processing unit responds to the measured aerial output voltage by adjusting the adjustable inductor until the aerial impedance is approximately matched to the radio frequency signal generator impedance.

25 Claims, 11 Drawing Sheets

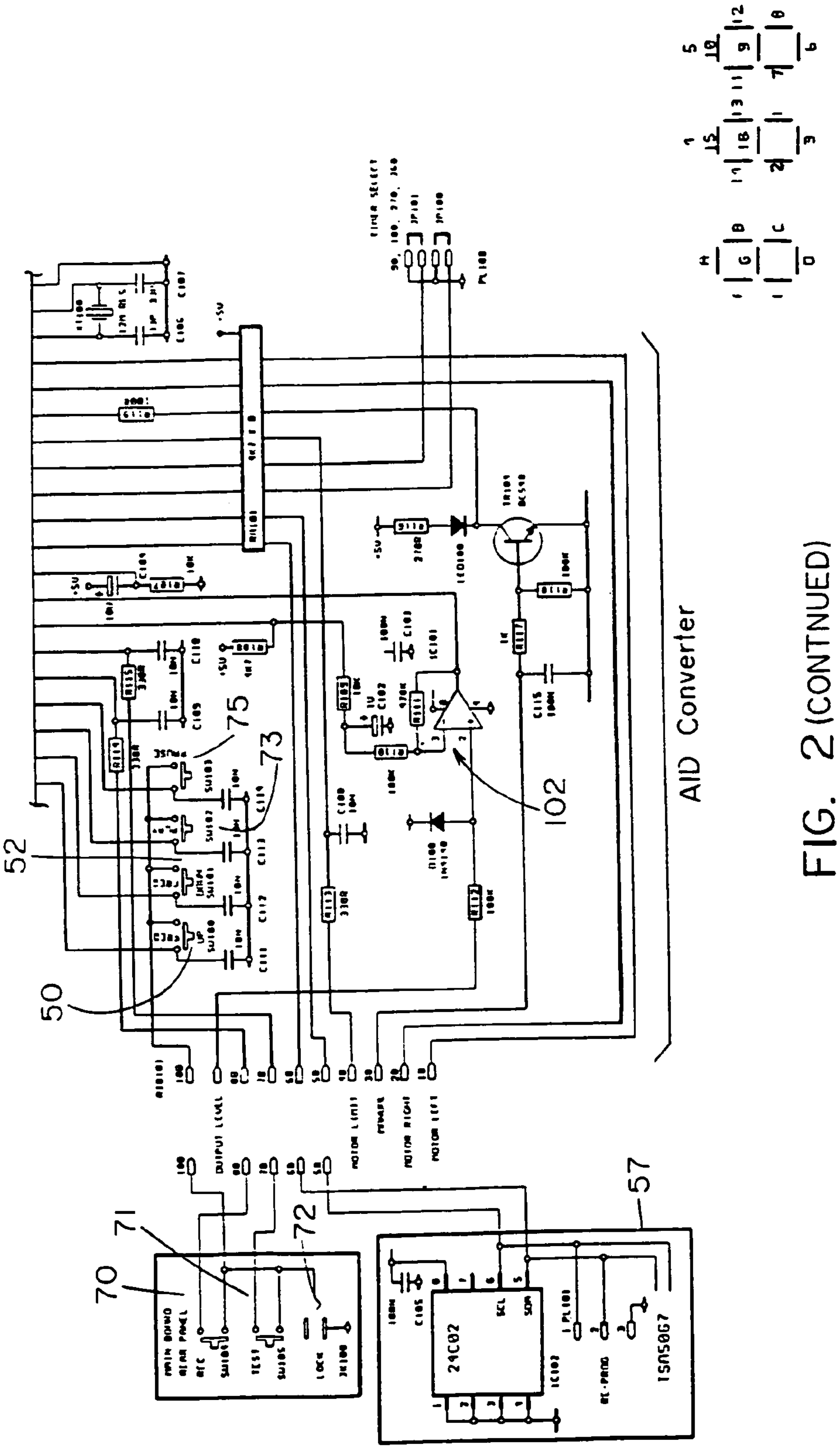
FIG. 2 (CONTNUED)

| TIME | JP200 | JP201 | JP202 | IC200 | IC201 | IC202 |
|---|---|---|---|---|---|---|
| 90 | OPEN | OPEN | FIT | | | FIT |
| 180 | OPEN | FIT | OPEN | | FIT | FIT |
| 270 | FIT | OPEN | OPEN | FIT | FIT | FIT |
| 360 | NA | NA | NA | NA | NA | NA |

AUTOMATIC TUNING AM TRANSMITTER

CROSS-REFERENCE TO RELATED APPLICATION

This is a continuation-in-part of earlier filed, application Ser. No. 09/201,366, filed Nov. 30, 1998, now U.S. Pat. No. 6,295,443.

FIELD OF THE INVENTION

The present invention relates generally to radio transmitters, and more particularly to an apparatus and a method that automatically matches transmitter impedance to aerial impedance for a selected radio transmission frequency.

BACKGROUND OF THE INVENTION

There are many instances where information needs to be transmitted quickly and cheaply. Amplitude modulation (or AM) radio transmission can be easily and inexpensively accomplished and, despite some deficiencies, is very attractive for many applications. In particular, new types of highly-specialized, direct radio advertising can be achieved using AM radios, such as for example, AM radios transmitting in the frequency band 510–1705 kilohertz.

One relatively new application for AM radios is in the sale of real estate. Recently, real estate of various types, but particularly residential homes, has been equipped with a radio transmitter which broadcasts a pre-recorded message describing the real estate and its features. A prospective buyer may then drive to the property and tune his or her automobile radio to the broadcast frequency of the radio transmitter and listen to the pre-recorded message. The system can operate 24 hours a day, seven days a week until the property is sold. Thus, prospective buyers may gather information at any time, not just those times when the property is open for inspection or when a real estate agent is available to show the property. Furthermore, the system has the ability to reach casual buyers who may not presently be interested in purchasing real estate, but who, if attracted to a property they pass by, may listen to a prerecorded message in their automobile. This initial exposure may lead to a purchase in some cases.

While direct radio marketing broadcasts have certain advantages, such broadcasts must meet Federal Communications Commission (FCC) restrictions related to signal frequency and strength. More specifically, the FCC has created specific regulations directed to the operation of unlicensed radio transmitters operating in the frequency band 510–1705 kilohertz. The FCC requires that the total input power supplied to the final radio frequency stage not exceed 100 milliwatts. Power supplied to a filament and/or a heater are not required to be included in the total input power calculation. In addition, the total length of the transmission line, antenna and ground lead (if used) should not exceed a total length of three meters or 9.84 feet.

Another FCC requirement is that direct marketing broadcasts not interfere with other radio signals such as commercial radio stations. Another consideration to be made when designing a transmitter for real estate sales is that several AM radios might be used in the same geographical area if multiple properties in that area are for sale at the same time. The proximity of many radio signals may cause interference, particularly if the radios broadcast on only one frequency. Thus, a direct marketing radio transmitter must be designed so that the frequency of its broadcast signal can be selected from a range of frequencies depending on the specific placement to be made.

SUMMARY OF THE INVENTION

In accordance with an aspect of the invention, a method is provided for matching an aerial impedance to a generator impedance of a radio transmitter. The method includes the step of providing an aerial having a length equal to or less than approximately three meters and receiving a total input power having a magnitude equal to or less than approximately 100 milliwatts. A transmission frequency is selected from a range of approximately 510 kilohertz to approximately 1705 kilohertz. The aerial output voltage is measured at the selected transmission frequency; and the magnitude of the aerial impedance is automatically adjusted until the measured aerial output voltage reaches a substantially maximum value.

In accordance with another aspect of the invention, a radio transmitter is adapted to automatically adjust aerial impedance for a selected radio frequency. The radio transmitter includes a tunable radio frequency signal generator that has an impedance and is adapted to generate a radio frequency signal in the range of approximately 510 kilohertz to approximately 1705 kilohertz. The radio transmitter is also adapted to receive less than or equal to approximately 100 milliwatts of total input power. An aerial coupled to the tunable radio frequency signal generator and is adapted to transmit the radio frequency signal. The aerial has an output voltage, an aerial impedance and a length of less than or equal to approximately three meters. An adjustable inductor coupled to the aerial. A sampler coupled to the aerial and is adapted to measure the aerial output voltage. A processing unit is coupled to the sampler and to the adjustable inductor. The processing unit responds to the measured aerial output voltage by adjusting the adjustable inductor until the aerial impedance is approximately matched to the radio frequency signal generator impedance.

DETAILED DESCRIPTION

Figure 1:
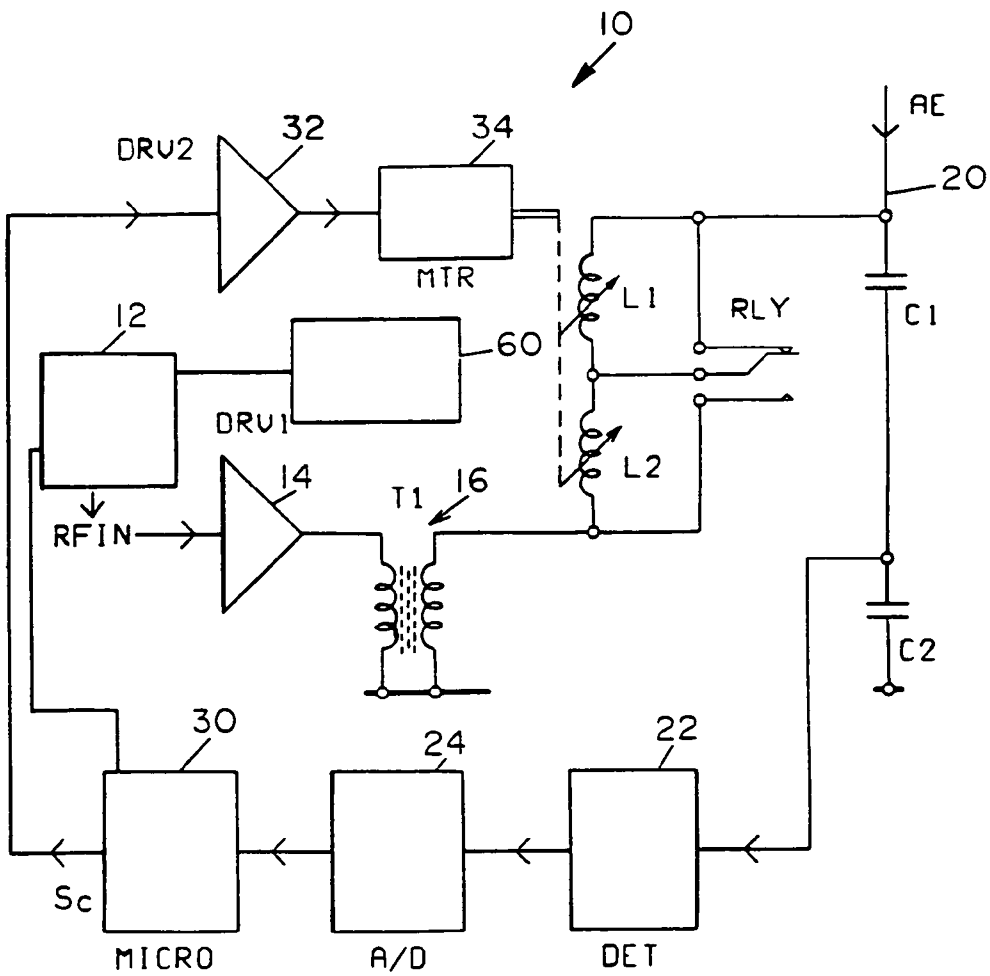
FIG. 1 is a schematic diagram of a preferred embodiment of a radio transmitter.

A transmitter 10 constructed according to the teachings of the present invention is shown schematically in FIG. 1. The transmitter 10 includes a radio frequency (RF) generator 12 which generates an RF signal $RF_{IN}$. The $RF_{IN}$ signal is fed to a power amplifier 14 and through a coupling transformer 16. The signal is then fed from the coupling transformer 16 to a pair of motor-driven coils $L_1$ and $L_2$. The coil $L_1$ is designed to tune to signals from about 1000 kHz to about 1705 kHz and the coil $L_2$ is designed to tune to signals from about 510 kHz to about 1000 kHz. Since the frequency range of each of the coils $L_1$ and $L_2$ is limited, the transmitter 10 can not tune to the second harmonic of the transmission signal. Only the fundamental of the signal can be found. This limitation on the frequency range reduces or eliminates interference with other broadcast services.

The tuned signal from the coils is then fed to an antenna or aerial 20. The output signal of the coils is sampled using capacitors $C_1$ and $C_2$ and rectified using a detector circuit 22. The sampled and rectified signal is converted to a digital signal by an analog-to-digital (A/D) converter 24. The digital signal is then fed into a microprocessor 30. The microprocessor 30 analyzes the level of the digital signal. As will be explained in greater detail below, the microprocessor 30 is programmed to adjust the tuning coils $L_1$ and $L_2$ so that the highest possible voltage is developed on the aerial 20. Specifically, the microprocessor 30 generates a control signal SC which is delivered to a second power amplifier 32. After the control signal $S_c$ has been amplified, it is delivered to a motor 34 which adjusts the position of two ferrite cores 40 and 42 (FIG. 6) to adjust the inductive reactance of the coils $L_1$ and $L_2$, and, therefore, the amplitude of the output signal of the transmitter 10. The radio transmitter 10 should be adapted to operate on a total input power of less than or equal to 100 milliwatts. The total input power calculation does not include any power that may be required to operate a filament or a heater. In addition, the aerial 20 should preferably have a length of less than or equal to approximately three meters. In the event that a transmission line and/or ground lead is employed, the length of the transmission line and/or ground lead should be added to the length of the aerial 20 and total length of all such components employed should not exceed a total length of approximately three meters.

Figure 2:
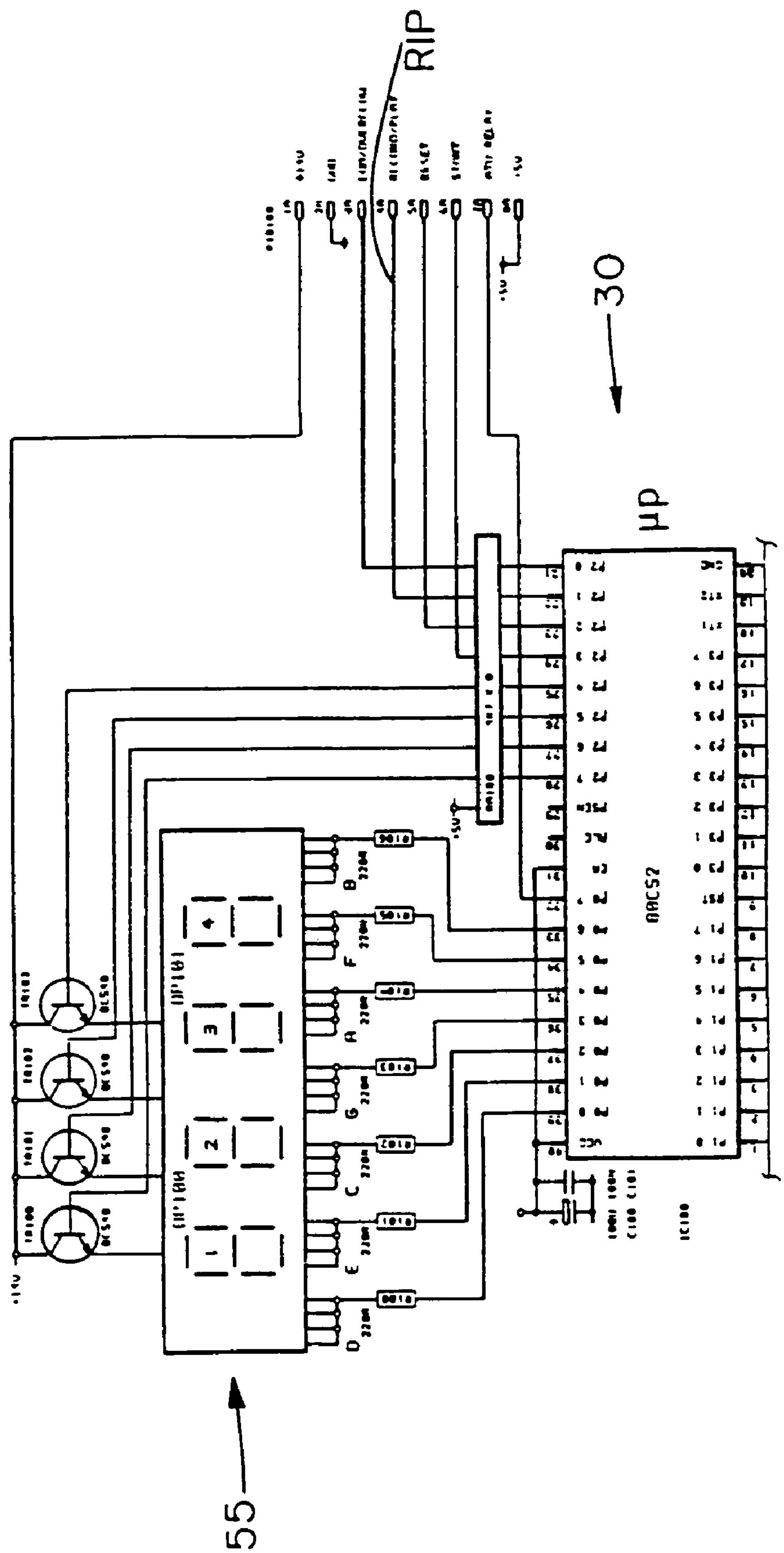
FIG. 2 is a circuit diagram of the microprocessor and its associated circuitry of the radio transmitter of FIG. 1.
Figure 4A:
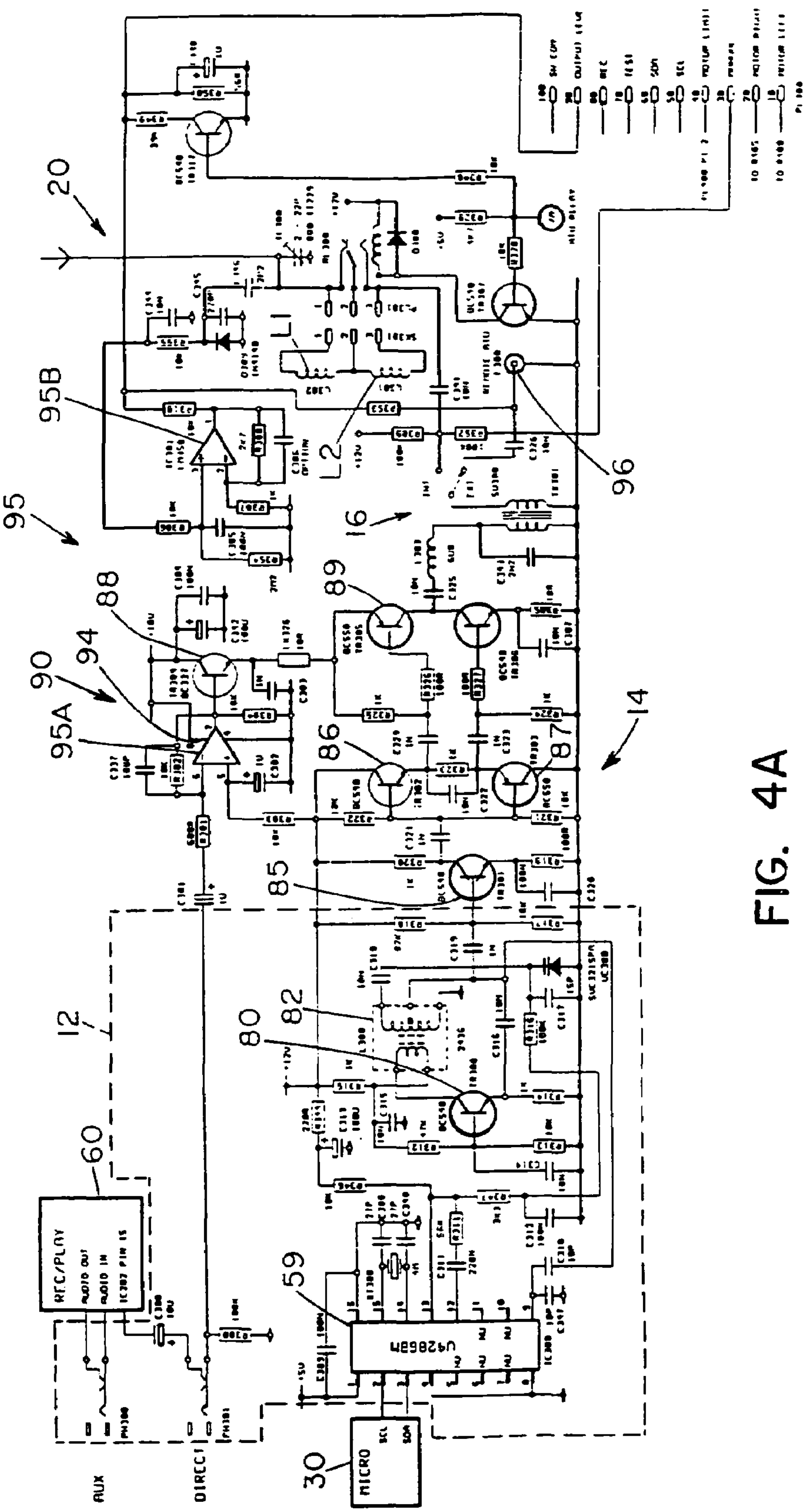
FIG. 4A is a circuit diagram of the transmitter of FIG. 1.

Having described the general operation of the transmitter 10, the individual components will be described in more detail. Referring to FIG. 2, the microprocessor 30, which may be any commonly available microprocessor, is designed to accept user input through switches 50 and 52. Using switches 50 and 52, a user may select a desired transmission frequency for the transmitter 10. The transmission frequency is displayed on a seven-segment display 55 and a user may tune up to a higher frequency using the switch 50 and tune down to a lower frequency using the switch 52. The selected frequency is stored in a non-volatile memory 57 and fed to a phase-locked loop (PPL) 59 (FIG. 4A) in the generator 12. As shown in FIG. 4A, the microprocessor 30 and PLL 59 communicate through a serial data line (SDA) and a serial clock line (SCL) (ports 3.0 and 3.1 in FIG. 2).

Figure 3:
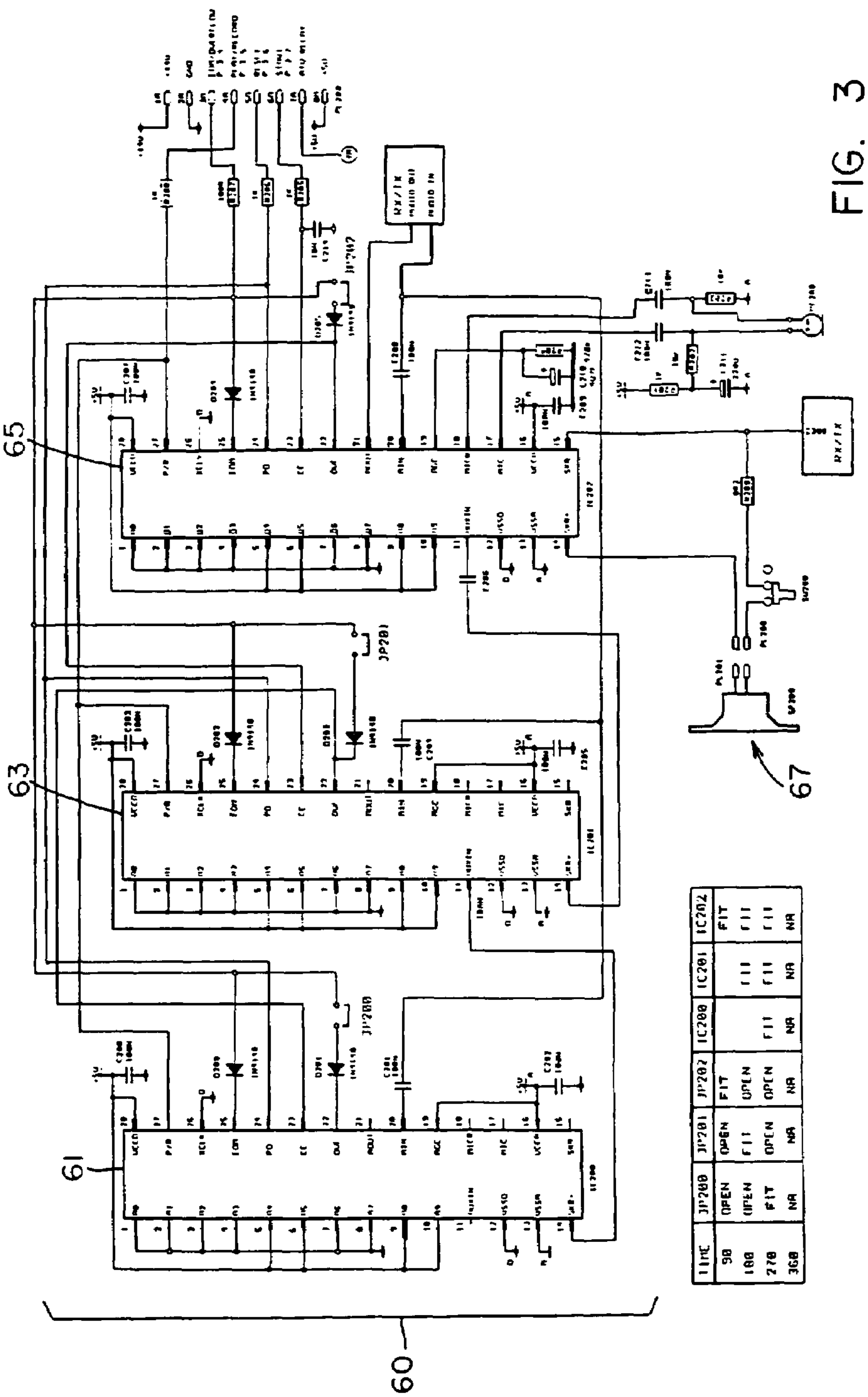
FIG. 3 is a circuit diagram of an audio recording/playback device used in a preferred embodiment.

The microprocessor 30 is also coupled by line RIP to a digital record/playback device 60 which consists of three identical record/playback integrated circuits 61, 63, and 65 (FIG. 3). Integrated circuits suitable for use in the present invention may be obtained from Information Storage Devices under model no. ISD 2590. The record/playback device 60 includes a speaker monitor 67 for monitoring the recorded message. The operation of the record/playback device 60 is controlled by five user controlled input switches coupled to the microprocessor 30: record switch 70; test switch 71; lock switch 72; play switch 73; and pause switch 75 (FIG. 2).

Figure 4B:
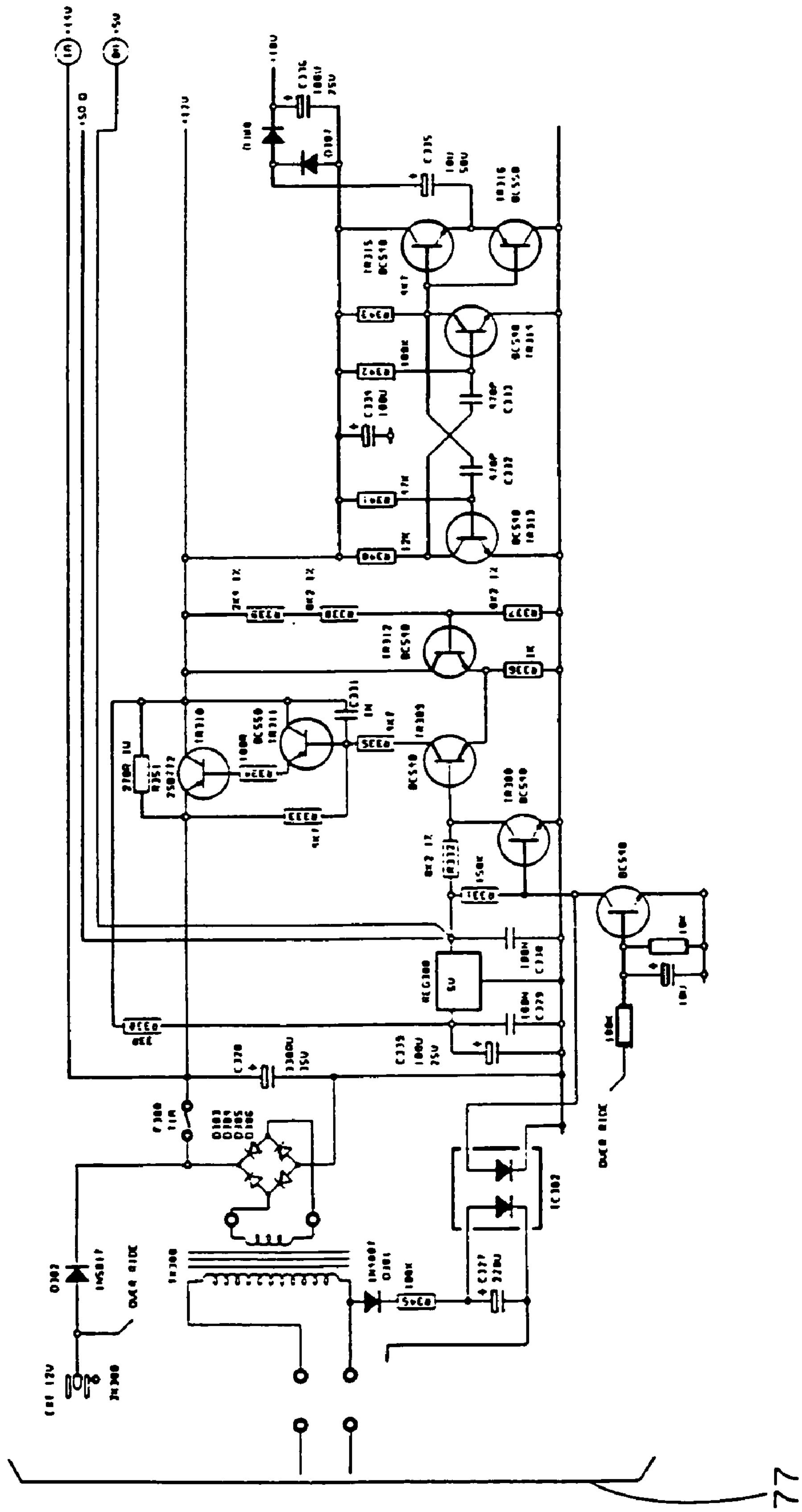
FIG. 4B is a circuit diagram of a power supply unit used in a preferred embodiment.
Figure 5:
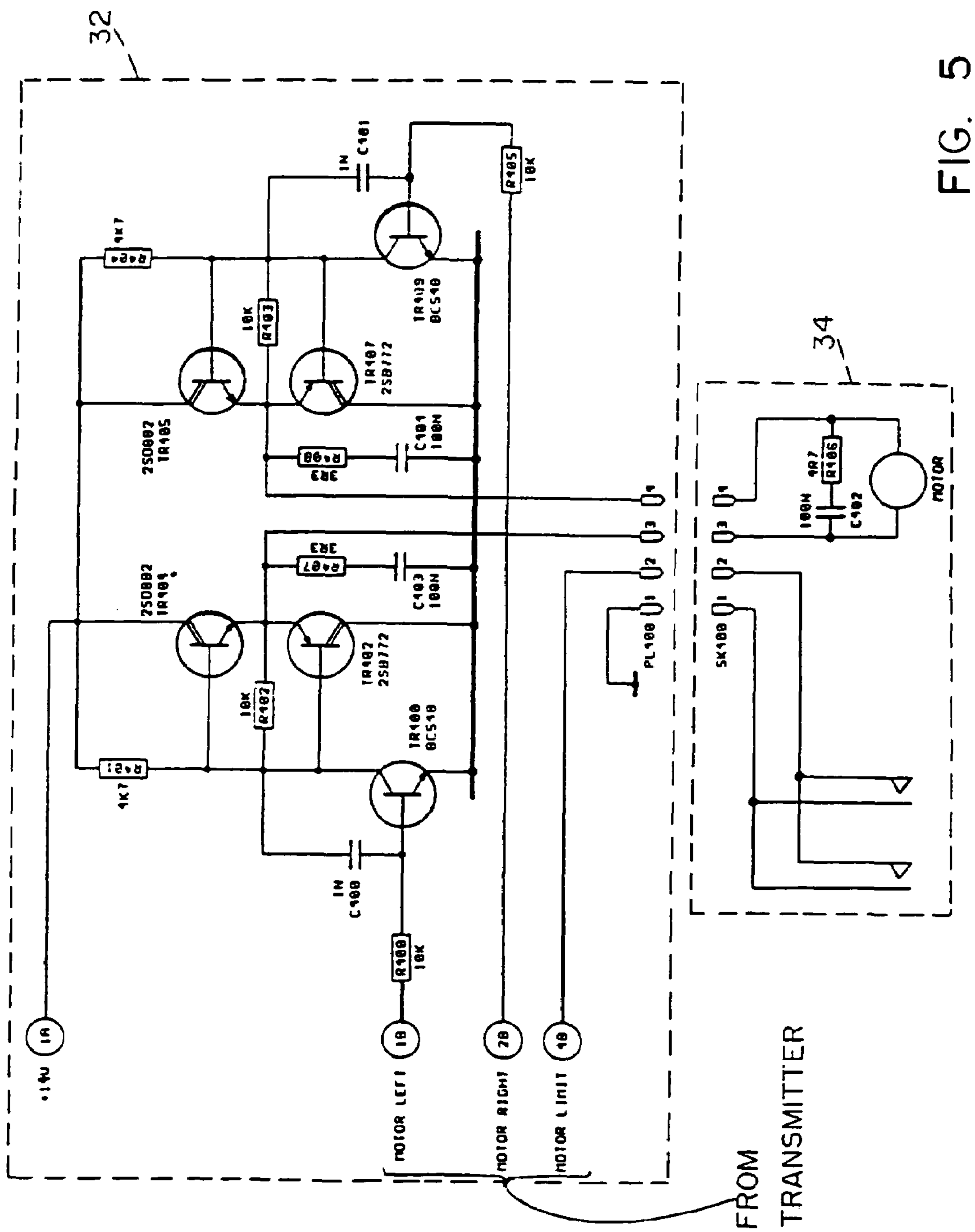
FIG. 5 is a circuit diagram of the amplifier of FIG. 1.

As best seen by reference to FIG. 4B, the transmitter 10 includes a power supply unit (PSU) 77. The PSU 77 is of substantially conventional design and, therefore, will not be discussed in detail herein. As should be understood, the PSU 77 supplies power for the generator 12 and other components of the transmitter 10.

As may be seen by reference to FIG. 4A, the PLL 59, transistor 80, and transformer 82 are used to generate the $RF_{IN}$ signal. As indicated above, the $RF_{IN}$ signal is amplified by the power amplifier 14, which includes transistors 85, 86, 87, 88, and 89. The output of the record/playback device is fed to modulator 90 (transistor 88) which is driven by the first stage 95A of a dual operational amplifier 95, which also has a second stage 95B. The modulated audio signal, at the chosen frequency, is then fed to the aerial 20. Alternatively, the modulated audio signal may be fed to a remote aerial (discussed below) through a connector 96.

As noted above, the impedance of the generator 12 is matched to aerial 20 to maximize its output voltage and achieve a high Q or quality factor. The Q of the aerial 20 is the ratio of the resonance frequency to the bandwidth between frequencies on opposite sides of the resonance frequency ("half-power points") where the response of the aerial 20 differs by about 3 decibels from the response level at resonance. The resonance-excitation frequency equals the natural frequency of the circuit. By adjusting the impedance of the aerial 20, the natural frequency of the transmitter can be adjusted so that resonance or near resonance occurs at the user-selected broadcast frequency, resulting in the highest possible output. More specifically, the inductive reactance $R_L$ of the coils $L_1$ and $L_2$ is adjusted by moving the ferrite cores 40 and 42.

Movement of the cores 40 and 42 is controlled by the microprocessor 30 using a feedback loop. As indicated, the microprocessor 30 controls the PLL 59. In order to set the oscillation frequency of the PLL 59, the output voltage of the generator 12 is fed to the aerial 20 and, as best seen by reference to FIGS. 1 and 4, fed back to the microprocessor 30. The signal is sampled via a capacitor 100, rectified to DC, and amplified by the second stage 95B of the operational amplifier 95.

Using the feed-back it receives, the microprocessor 30 generates a variable pulse-width signal which is integrated to give a variable DC reference voltage for a comparitor 102 (FIG. 2). When the comparitor 102 changes state, the microprocessor 30 knows that the aerial DC reference voltage equals the DC reference voltage generated by the microprocessor 30. Using this information, the microprocessor 30 raises its reference DC voltage while moving the cores 40 and 42, checking for an equal increase in the aerial DC reference voltage. There comes a point where the aerial DC reference voltage falls relative to the microprocessor DC reference voltage. At that point, the microprocessor 30 knows that the optimum has been passed and reverses the core movement to find the actual peak.

While monitoring the output of antenna 20, the microprocessor 30 drives the motor 34 to move the ferrite cores 40 and 42 of the tuning coils $L_1$ and $L_2$. The microprocessor 30 is programmed to monitor the Q of the aerial 20. When the Q of the aerial 20 reaches a maximum, the microprocessor 30 turns the motor 30 off, fixing the cores 40 and 42 in position. As noted above, the coils $L_1$ and $L_2$ are designed to be tuned to different frequencies. Thus, only one of the coils is active at a time. A relay 110 controls which of the coils $L_1$ or $L_2$ is energized. The relay 110 is controlled by the microprocessor 30, which upon sensing the desired input frequency set by the user will pick the appropriate coil to use, depending on whether the input frequency falls within the range of coil $L_1$ (about 1000 kHz to about 1705 kHz) or coil $L_2$ (about 510 kHz to about 1000 kHz).

Figure 6:
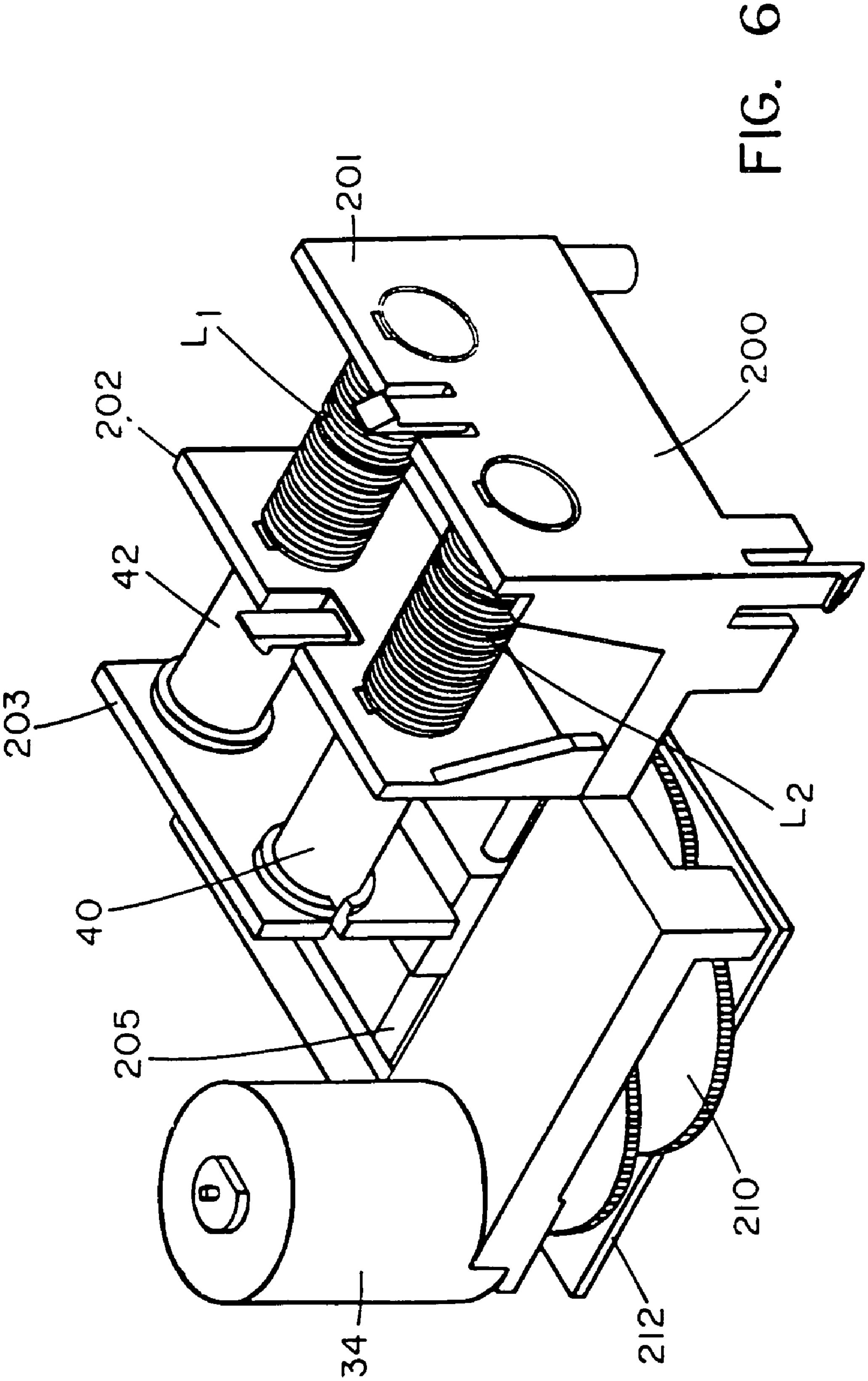
FIG. 6 is a perspective view of the motor and adjustable inductive coils used in the preferred embodiment.

As seen in FIG. 6, the tuning coils $L_1$ and $L_2$ are mounted on a support structure 200 having two end plates 201 and 202. The ferrite cores 40 and 42 are mounted on a carriage 203 which rides on a pair of tracking bars 205. The carriage 203 is engaged by a gear 207 which is driven by the motor 34 through a gear chain 210 which is supported by a bearing plate 212. Depending on the control signal sent to the motor 34, the ferrite cores 40 and 42 are moved into or out of the inductive coils $L_1$ and $L_2$.

Figure 7:
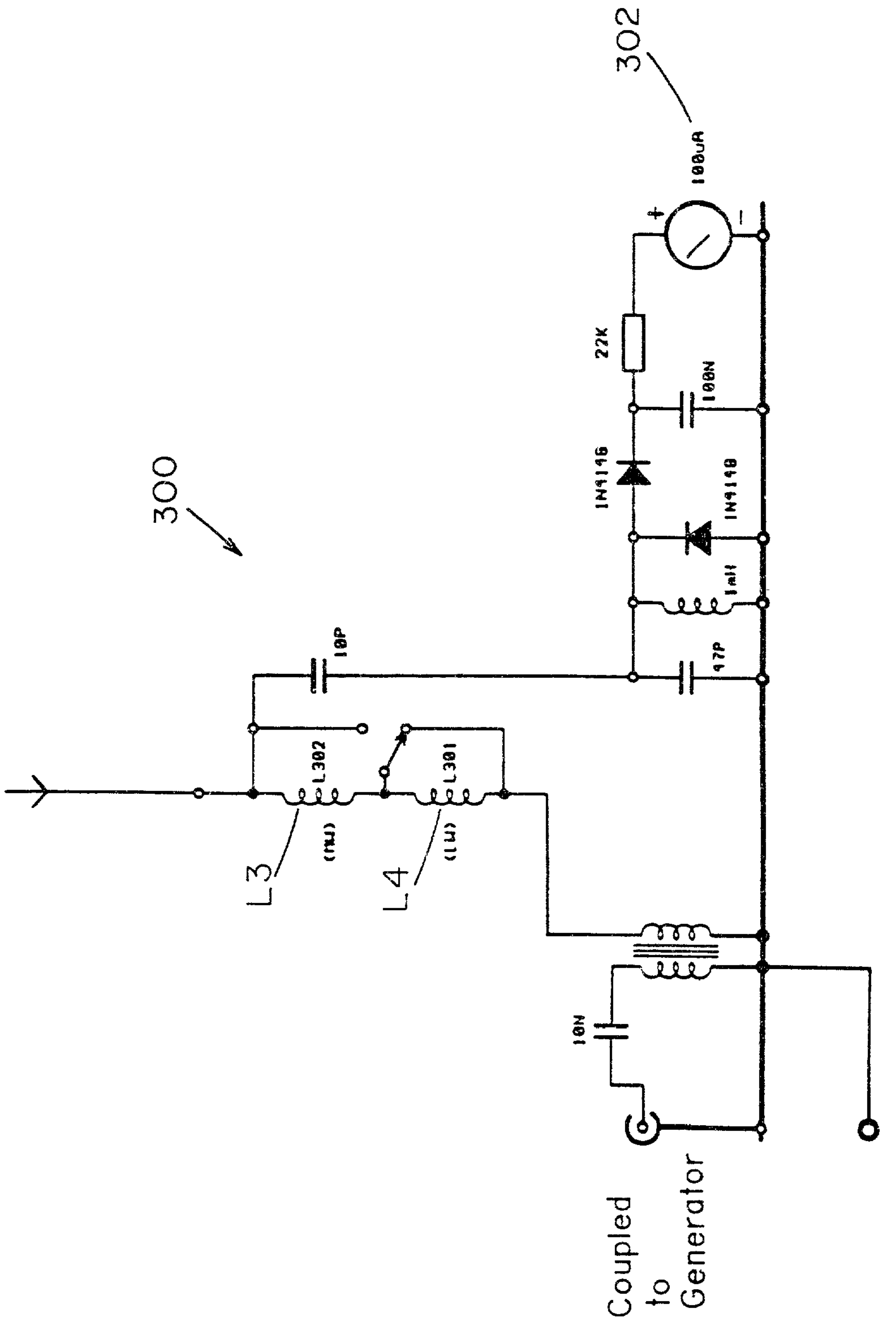
FIG. 7 is a circuit diagram of the remote aerial of FIG. 1.

As indicated above, in an alternative embodiment of the present invention a remote aerial 300 (FIG. 7) may be coupled to the generator 12 through the connector 96 in place of the aerial 20. The remote aerial 300 includes a voltmeter 302 and two coils $L_3$ and $L_4$. Using the meter 302, the coils $L_3$ and $L_4$ may be tuned manually to mimic the automatic tuning of the aerial 20. The remote aerial 300 is particularly useful for those circumstances where the building in which the transmitter unit is placed shields or screens radio signals that are broadcast from inside of it.

Figure 8:
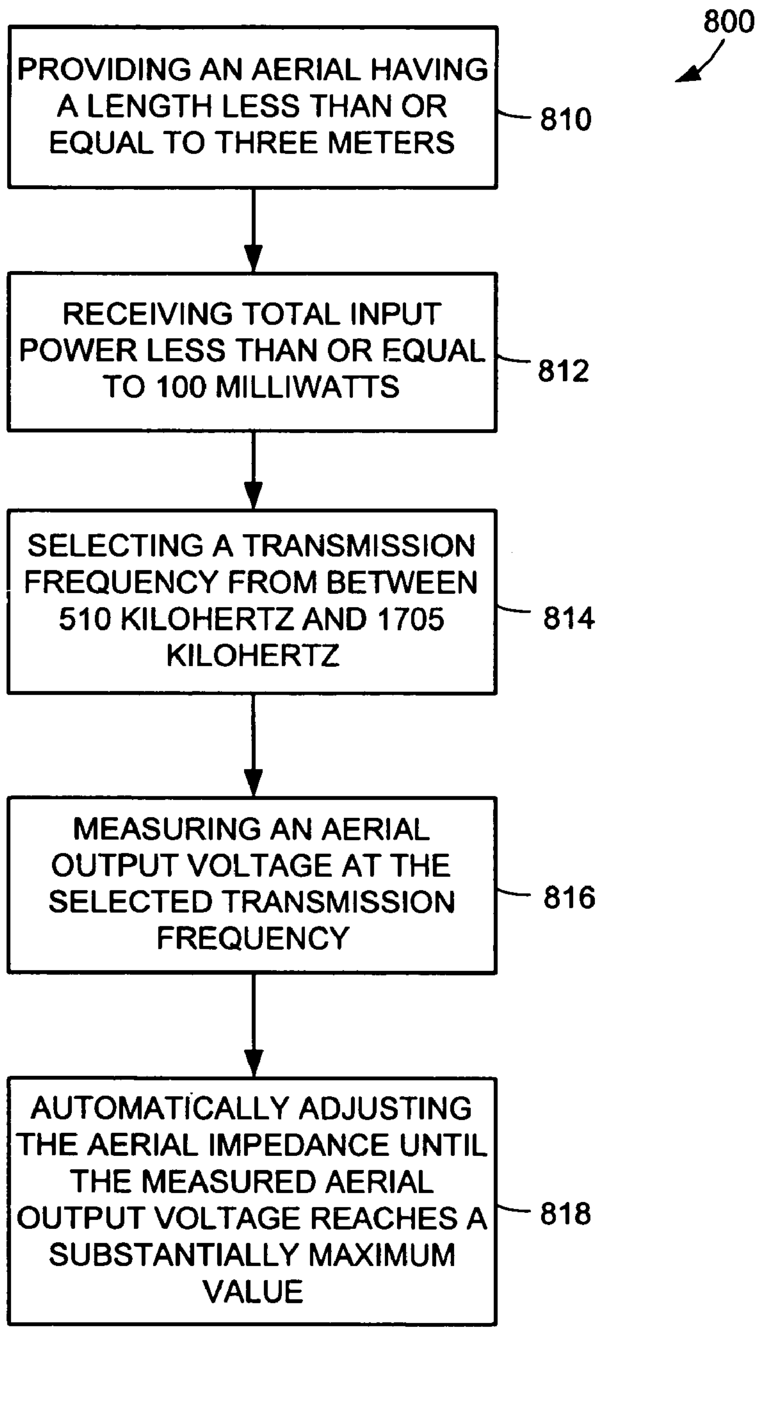
FIG. 8 is a flowchart illustrating a method of matching the aerial impedance to the generator impedance of the radio transmitter of FIG. 1.

Referring to FIG. 8, a flowchart illustrating a method of matching the aerial impedance to the generator impedance of the radio transmitter 800 begins at step 810 with providing an aerial having a length that is equal to or less than approximately three meters in accordance with FCC regulations. In the event that a transmission line and/or a ground lead in employed, the FCC further requires that the length of the transmission line and/or ground lead be added to the length of the antenna and that the total length not exceed approximately three meters. At step 812, the radio transmitter receives a total input power of less than or equal to approximately 100 milliwatts. The FCC requires that the total input power supplied to the final radio frequency stage not exceed a maximum of approximately 100 milliwatts. The total input power calculation does not include power supplied to a radio transmitter filament or a radio transmitter heater. At step 814, a transmission frequency from a range of approximately 510 kilohertz to approximately 1705 kilohertz is selected. The FCC does not require a license to operate in the frequency range of approximately 510 kilohertz to approximately 1705 kilohertz as long as the aerial length restrictions and input power restrictions are respected. At step 816, the aerial output voltage is measured at the selected transmission frequency and at step 818, the impedance of the aerial is automatically adjusted until the measured aerial output voltage reaches a substantially maximum value.

Figure 9:
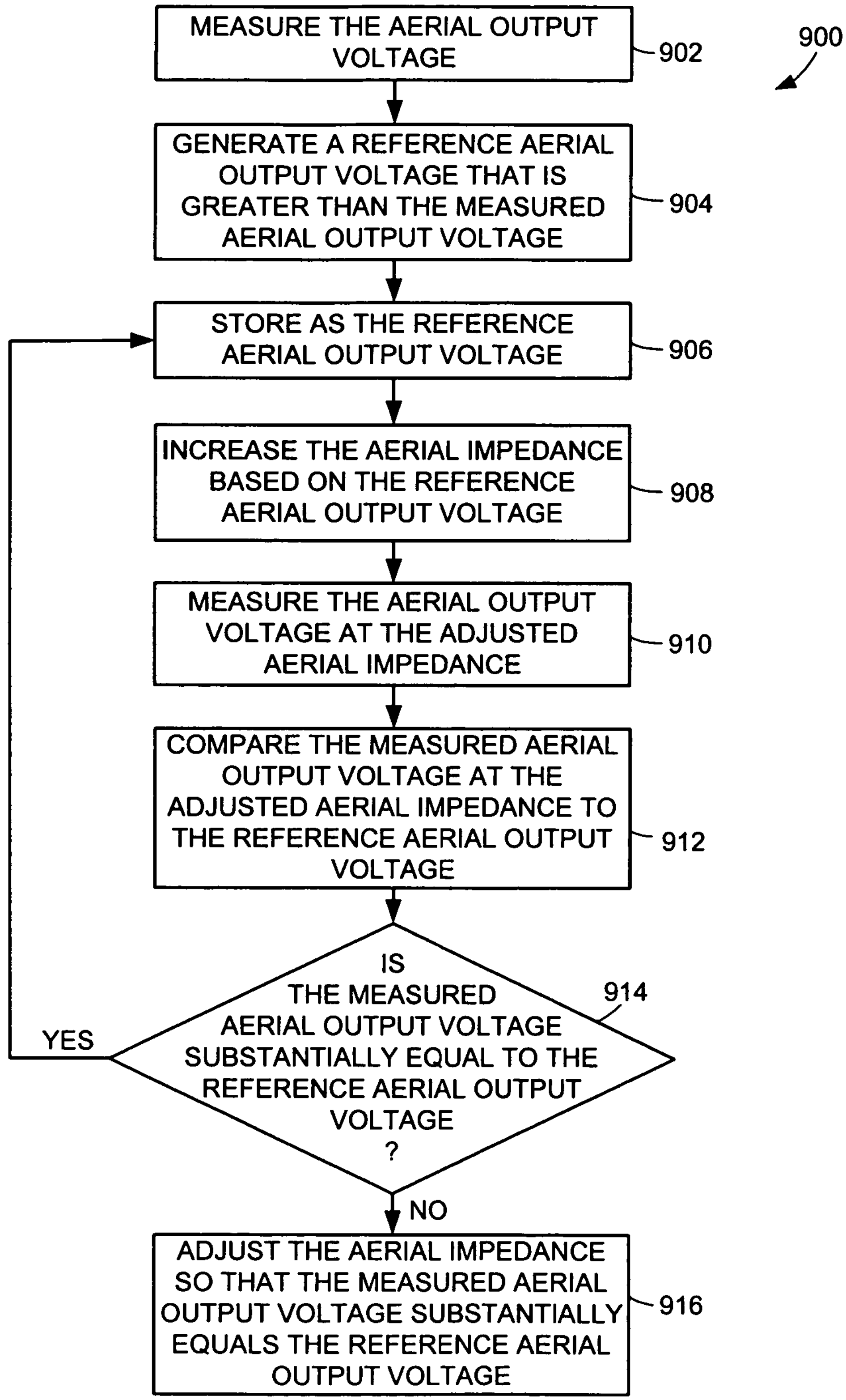
FIG. 9 is a flowchart illustrating a method of adjusting the aerial impedance of the aerial of FIG. 1.

Referring to FIG. 9 a flowchart illustrating a method of adjusting the aerial impedance 900 by automatically increasing the magnitude of the aerial impedance until the magnitude of the measured aerial output voltage is substantially equal to a maximum value. More specifically, the magnitude of the aerial impedance is automatically incrementally increased on a periodic basis until the measured aerial output voltage has a magnitude that is less than the magnitude of a previously measured aerial output voltage and then decreasing the magnitude of the aerial impedance until the measured aerial output voltage is substantially equal to the previously measured aerial output voltage.

The method 900 begins at step 902 with measuring the aerial impedance. A reference aerial output voltage having a value that is greater than that of the measured aerial output voltage is generated at step 904 and stored at step 906. The aerial impedance is increased based on the stored reference aerial output voltage at step 908 and the adjusted aerial output voltage is measured at step 910. The measured aerial output voltage at the adjusted aerial impedance is compared to the stored reference aerial output voltage at step 912. If the measured aerial output voltage is substantially equal to the reference aerial output voltage at step 914, the value of the measured aerial output voltage is stored as the reference aerial output voltage. If the measured aerial output voltage is not substantially equal to the reference aerial output voltage at step 914, the aerial impedance is adjusted, in this case decreased, so that the measured aerial output voltage substantially equals the value of the reference aerial output voltage. The value of the reference aerial output voltage is essentially the value of the previously measured aerial output voltage prior to incrementally increasing the aerial impedance.

In an another embodiment, the aerial impedance can be adjusted by automatically decreasing the magnitude of the aerial impedance until the magnitude of the measured aerial impedance is substantially equal to a maximum value. More specifically, the magnitude of the aerial impedance is automatically incrementally decreased on a periodic basis until the measured aerial output voltage has a magnitude that is less than the magnitude of a previously measured aerial output voltage. The magnitude of the aerial impedance is then increased until the measured aerial output voltage is substantially equal to the previously measured aerial output voltage.

As mentioned previously, the magnitude of the impedance on the aerial is adjusted by adjusting the inductance of an adjustable inductor coupled to the aerial. The adjustable inductor includes the pair of motor driven coils $L_1$ and $L_2$ In an alternate embodiment, the coil $L_1$ can be adjusted to the appropriate inductance when the selected transmission frequency is with a range of approximately 510 kilohertz to approximately 1000 kilohertz and the coil $L_2$ can be adjusted to the appropriate inductance when the selected transmission frequency is within a range of approximately 1000 kilohertz to approximately 1705 kilohertz. While preferred frequency ranges are provided for each of the tuning coils, the same or an alternative number of tuning coils covering different ranges of frequencies can be employed without departing from the spirit of the invention.

While the present invention has been described in what is believed to be the most preferred forms, it is to be understood that the invention is not confined to the particular examples and arrangement of the components herein illustrated and described, but embraces such modified forms thereof as come within the scope of the appended claims.

What is claimed is:

1. A method of matching an aerial impedance to a generator impedance of a radio transmitter, the method comprising the steps of:

providing an aerial having a length of less than or equal to approximately three meters;

receiving a total input power having a magnitude of less than or equal to approximately 100 milliwatts;

selecting a transmission frequency from a range of approximately 510 kilohertz to approximately 1705 kilohertz;

measuring an aerial output voltage at the selected transmission frequency; and automatically adjusting a magnitude of an impedance of the aerial until the measured aerial output voltage reaches a substantially maximum value.

2. The method of claim 1, further including the step of providing a transmission line wherein the total length of the aerial and the transmission line is less than or equal to approximately three meters.

3. The method of claim 1, further including the step of providing a ground lead where the total length of the aerial and the ground lead is less than or equal to approximately three meters.

4. The method of claim 1, further including the step of providing a transmission line and a ground lead where the total length of the aerial, the transmission line and the ground lead is less than or equal to approximately three meters.

5. The method of claim 1, wherein the total input power comprises the total input power supplied to the final radio frequency stage.

6. The method of claim 5, wherein the value of the total input power excludes the amount of power supplied to a filament and to a heater.

7. The method of claim 1, wherein the step of automatically adjusting the magnitude of the aerial impedance further includes automatically increasing the magnitude of the aerial impedance until the magnitude of the measured aerial output voltage is substantially equal to a maximum value.

8. The method of claim 1, wherein the step of measuring the aerial output voltage further includes measuring the aerial output voltage on a periodic basis and the step of automatically adjusting the magnitude of the aerial impedance further includes the steps of automatically incrementally increasing the magnitude of the aerial impedance on a periodic basis until the measured aerial output voltage has a magnitude that is less than the magnitude of a previously measured aerial output voltage and decreasing the magnitude of the aerial impedance until the measured aerial output voltage is substantially equal to the previously measured aerial output voltage.

9. The method of claim 8, further including the step of storing the measured aerial output voltage as a previously measured aerial output voltage prior to incrementally increasing the aerial impedance.

10. The method of claim 1, wherein the step of automatically adjusting the magnitude of the aerial impedance further includes automatically decreasing the magnitude of the aerial impedance until the magnitude of the measured aerial impedance is substantially equal to a maximum value.

11. The method of claim 1, wherein the step of measuring the aerial output voltage further includes measuring the aerial output voltage on a periodic basis and the step of automatically adjusting the magnitude of the aerial impedance further includes automatically incrementally decreasing the magnitude of the aerial impedance on a periodic basis until the measured aerial output voltage has a magnitude that is less than the magnitude of a previously measured aerial output voltage and increasing the magnitude of the aerial impedance until the measured aerial output voltage is substantially equal to the previously measured aerial output voltage.

12. The method of claim 11, further including the step of storing the measured aerial output voltage as a previously measured aerial output voltage prior to incrementally decreasing the aerial impedance.

13. The method of claim 1, wherein the step of automatically adjusting the magnitude of the aerial impedance further includes adjusting the inductance of an adjustable inductor coupled to the aerial.

14. The method of claim 13, wherein the step of adjusting the inductance of the adjustable inductor further includes adjusting the inductance of a first coil when the selected transmission frequency is with a range of approximately 510 kilohertz to approximately 1000 kilohertz and adjusting the inductance of a second coil when the selected transmission frequency is within a range of approximately 1000 kilohertz to approximately 1705 kilohertz.

15. A radio transmitter adapted to automatically adjust aerial impedance for a selected radio frequency, the radio transmitter comprising:

- a tunable radio frequency signal generator having an impedance, adapted to generate a radio frequency signal in the range of approximately 510 kilohertz to approximately 1705 kilohertz and adapted to receive less than or equal to approximately 100 milliwatts of total input power;
- an aerial coupled to the tunable radio frequency signal generator and adapted to transmit the radio frequency signal, the aerial having an output voltage, an aerial impedance and a length of less than or equal to approximately three meters;
- an adjustable inductor coupled to the aerial;
- a sampler coupled to the aerial and adapted to measure the aerial output voltage;
- a processing unit coupled to the sampler and to the adjustable inductor, the processing unit, responsive to the measured aerial output voltage, adjusting the adjustable inductor until the aerial impedance is approximately matched to the radio frequency signal generator impedance.

16. The radio transmitter of claim 15, further comprising a transmission line wherein the total length of the aerial and the transmission line is less than or equal to approximately three meters.

17. The radio transmitter of claim 15, further comprising a ground lead where the total length of the aerial and the ground lead is less than or equal to approximately three meters.

18. The radio transmitter of claim 15, further comprising a transmission line and a ground lead where the total length of the aerial, the transmission line and the ground lead is less than or equal to approximately three meters.

19. The radio transmitter of claim 15, wherein the total input power comprises the total input power supplied to the final radio frequency stage.

20. The radio transmitter of claim 15, wherein the value of the total input power excludes the amount of power supplied to a filament and to a heater.

21. The radio transmitter of claim 15, wherein the processing unit is further adapted to issue a command to iteratively increase the impedance of the adjustable inductor until the measured aerial output voltage ceases increasing thereby matching the aerial impedance to the radio frequency signal generator impedance.

22. The radio transmitter of claim 15, wherein the processing unit is further adapted to issue a command to iteratively decrease the impedance of the adjustable inductor until the measured aerial output voltage ceases increasing thereby matching the aerial impedance to the radio frequency signal generator impedance.

23. The radio transmitter of claim 15, wherein the adjustable inductor comprises a first tuning coil and a second tuning coil.

24. The radio transmitter of claim 23, wherein each of the first and second tuning coils comprises a ferrite core mounted on a motor driven carriage.

25. The radio transmitter of claim 15, further comprising a record/playback device coupled to the tunable radio frequency generator.

* * * * *